United States Patent
Han

(10) Patent No.: US 10,560,093 B1
(45) Date of Patent: Feb. 11, 2020

(54) SEMICONDUCTOR DEVICES

(71) Applicant: SK hynix Inc., Icheon-si Gyeonggi-do (KR)

(72) Inventor: Min Sik Han, Icheon (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/363,481

(22) Filed: Mar. 25, 2019

(30) Foreign Application Priority Data

Nov. 19, 2018 (KR) .......................... 10-2018-0142646

(51) Int. Cl.
*H03K 19/00* (2006.01)
*H04L 25/02* (2006.01)

(52) U.S. Cl.
CPC ..... *H03K 19/0005* (2013.01); *H04L 25/0298* (2013.01); *H04L 25/0278* (2013.01)

(58) Field of Classification Search
None
See application file for complete search history.

(56) References Cited

U.S. PATENT DOCUMENTS

| 7,928,757 B2 | 4/2011 | Nguyen et al. |
| 2016/0049180 A1* | 2/2016 | Tsukada .............. G11C 7/1057 365/189.05 |

FOREIGN PATENT DOCUMENTS

KR  1020070081881 A  8/2007

\* cited by examiner

*Primary Examiner* — Jany Richardson
(74) *Attorney, Agent, or Firm* — William Park & Associates Ltd.

(57) ABSTRACT

A semiconductor device includes a first termination circuit comprising an impedance value and configured to control the impedance value of the first termination circuit based on a first selection termination control signal and a termination control signal and a second termination circuit comprising an impedance value and configured to control the impedance value of the second termination circuit based on a second selection termination control signal and the termination control signal.

16 Claims, 9 Drawing Sheets

FIG. 4

| TCNT<3> | TCNT<2> | TCNT<1> | SCNT1 | DRV_CNT1<1> | DRV_CNT1<2> | DRV_CNT1<3> | DRV_CNT1<4> |
|---|---|---|---|---|---|---|---|
| L | L | L | L | L | L | L | L |
| L | L | H | L | L | L | L | H |
| L | H | L | L | H | L | L | L |
| L | H | H | L | H | L | L | H |
| H | L | L | L | H | H | L | L |
| H | L | H | L | H | H | L | H |
| H | H | L | L | H | H | H | L |
| H | H | H | L | H | H | H | H |
| X | X | X | H | H | H | H | H |

FIG.6

| DRV_CNT1<1> | DRV_CNT1<2> | DRV_CNT1<3> | DRV_CNT1<4> | OUTPUT DRIVER ON | TERMINATION RESISTANCE |
|---|---|---|---|---|---|
| H | L | L | L | 1 ON | RU |
| L | L | L | H | 6,7 ON | $\frac{RU}{2}$ |
| H | H | L | L | 1,2,3 ON | $\frac{RU}{3}$ |
| H | H | H | L | 1~5 ON | $\frac{RU}{5}$ |
| H | H | H | H | 1~7 ON | $\frac{RU}{7}$ |

SEMICONDUCTOR DEVICES

CROSS-REFERENCE TO RELATED APPLICATIONS

The present application claims priority under 35 U.S.C 119(a) to Korean Application No. 10-2018-0142646, filed on Nov. 19, 2018, which is incorporated herein by reference in its entirety.

BACKGROUND

1. Technical Field

Embodiments of the present disclosure generally relate to semiconductor devices configured to perform a termination operation.

2. Related Art

Signals inputted to semiconductor devices may be distorted due to impedance mismatch. Impedance mismatch may be caused by increased operation speeds and the reduction of power consumption with regards to the semiconductor devices. As such, the semiconductor devices may adjust impedance values of input/output (I/O) pads through a termination operation to prevent the input signals from being distorted.

SUMMARY

According to an embodiment, a semiconductor device may include a first mode register configured to store a first selection termination control signal and a second selection termination control signal when a mode register write operation is performed. The semiconductor device may include a first termination circuit comprising an impedance value and configured to control the impedance value of the first termination circuit based on the first selection termination control signal and a termination control signal. The semiconductor device may include a second termination circuit comprising an impedance value and configured to control the impedance value of the second termination circuit based on the second selection termination control signal and the termination control signal.

According to an embodiment, a semiconductor device may include a first mode register, a first termination circuit and a second termination circuit. The first mode register may comprise an impedance value and may be configured to control the impedance value of the first termination circuit based on a first selection termination control signal and a termination control signal. The second termination circuit may comprise an impedance value and may be configured to control the impedance value of the second termination circuit based on a second selection termination control signal and the termination control signal. The impedance value of the first termination circuit may be set to have a first resistance value when the first selection termination control signal is activated. The impedance value of the second termination circuit may be set to have the first resistance value when the second selection termination control signal is activated. The impedance values of the first and second termination circuits may be controlled to be substantially equal to each other according to a logic level combination of the termination control signal.

According to an embodiment, a semiconductor device may include a first termination circuit comprising an impedance value and configured to control the impedance value of the first termination circuit based on a first selection termination control signal and a termination control signal. The semiconductor device may include a second termination circuit comprising an impedance value and configured to control the impedance value of the second termination circuit based on a second selection termination control signal and the termination control signal. The impedance value of the first termination circuit may be set to have a first resistance value regardless of the termination control signal when the first selection termination control signal is activated. The impedance value of the second termination circuit is set to have the first resistance value regardless of the termination control signal when the second selection termination control signal is activated.

BRIEF DESCRIPTION OF THE DRAWINGS

FIG. 4 is a table illustrating an operation of the first termination decoder shown in FIG. 3.

FIG. 6 is a table illustrating an operation of the first output driver shown in FIG. 5.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
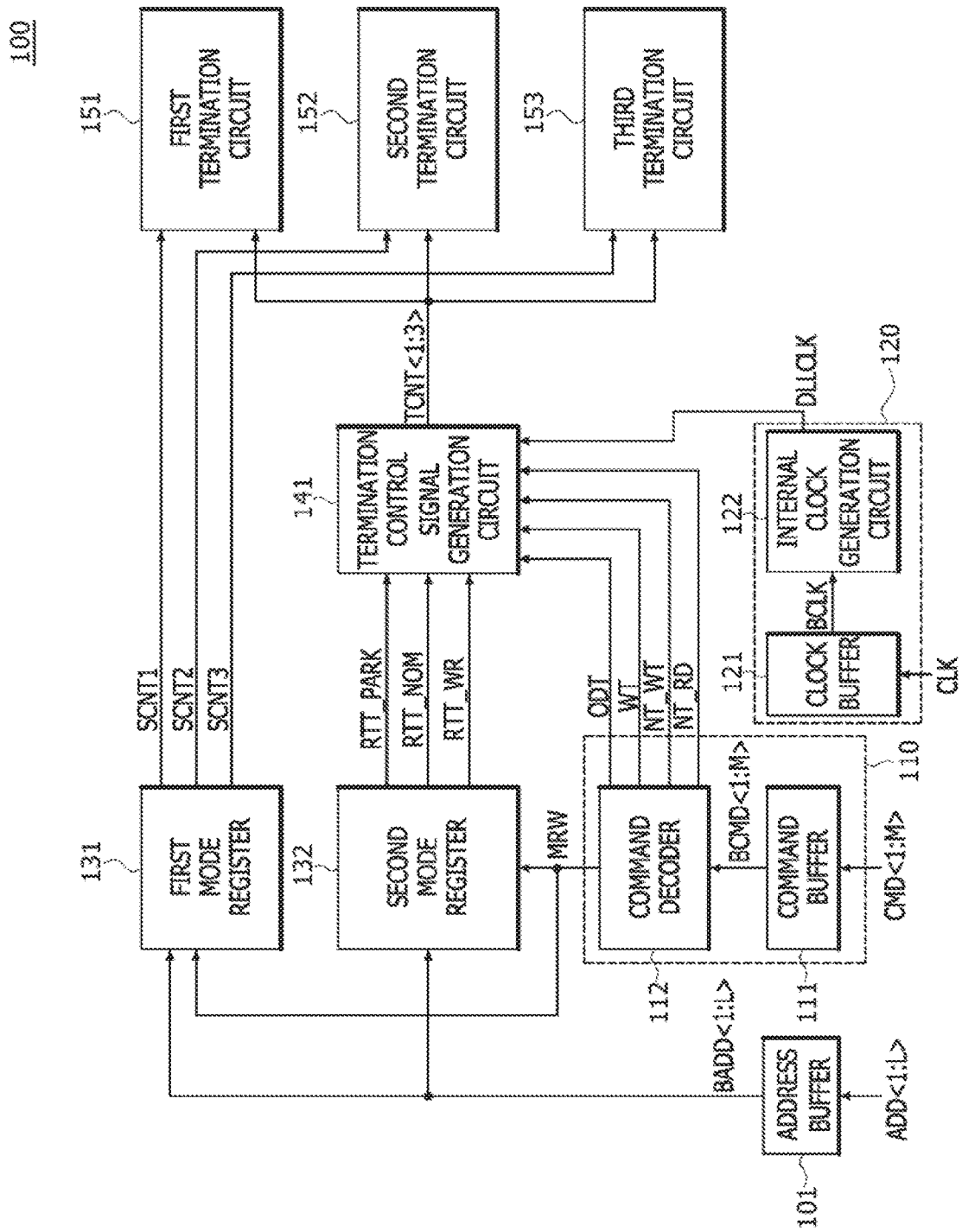
FIG. 1 is a block diagram illustrating a configuration of a semiconductor device according to an embodiment of the present disclosure.

As illustrated in FIG. 1, a semiconductor device 100 according to an embodiment may include an address buffer 101, a command input circuit 110, a clock input circuit 120, a first mode register 131, a second mode register 132, a termination control signal generation circuit 141, a first termination circuit 151, a second termination circuit 152 and a third termination circuit 153.

The address buffer 101 may buffer an address ADD<1:L> to generate a buffered address BADD<1:L>. The number "L" of bits included in each of the address ADD<1:L> and the buffered address BADD<1:L> may be set to be different according to the embodiments.

The command input circuit 110 may include a command buffer 111 and a command decoder 112. The command buffer 111 may buffer a command CMD<1:M> to generate a buffered command BCMD<1:M>. The number "M" of bits included in each of the command CMD<1:M> and the buffered command BCMD<1:M> may be set to be different according to the embodiments. The command decoder 112 may decode the buffered command BCMD<1:M> to generate a mode register write command MRW, an on-die termination command ODT, a write command WT, a non-target write command NT_WT and a non-target read command NT_RD. The mode register write command MRW may be generated to perform a mode register write operation that stores information into the first mode register 131 and the second mode register 132. The on-die termination command ODT may be generated to perform a termination operation for setting impedance values of the first termination circuit 151, the second termination circuit 152 and the third termination circuit 153. The write command WT may be generated to perform a write operation. The non-target write command NT_WT may be generated for some ranks that do not perform the write operation when the write operation is performed in any one of a plurality of ranks. The non-target read command NT_RD may be generated for some ranks that do not perform a read operation when the read operation is performed in any one of the plurality of ranks.

The clock input circuit 120 may include a clock buffer 121 and an internal clock generation circuit 122. The clock buffer 121 may buffer a clock signal CLK to generate a buffered clock signal BCLK. The internal clock generation circuit 122 may generate an internal clock signal DLLCLK from the buffered clock signal BCLK. The internal clock generation circuit 122 may be realized using, for example but not limited to, a delay locked loop circuit.

The first mode register 131 may extract a first selection termination control signal SCNT1, a second selection termination control signal SCNT2 and a third selection termination control signal SCNT3 from the buffered address BADD<1:L> to store the first to third selection termination control signals SCNT1, SCNT2 and SCNT3 therein if the mode register write command MRW is generated. Whether the first to third selection termination control signals SCNT1, SCNT2 and SCNT3 are activated or not may be determined according to a logic level combination of the buffered address BADD<1:L>. The first mode register 131 may output the first selection termination control signal SCNT1 extracted from the buffered address BADD<1:L> to the first termination circuit 151. The first selection termination control signal SCNT1 may be activated to set the impedance value of the first termination circuit 151 as a first resistance value. The first mode register 131 may output the second selection termination control signal SCNT2 extracted from the buffered address BADD<1:L> to the second termination circuit 152. The second selection termination control signal SCNT2 may be activated to set the impedance value of the second termination circuit 152 as the first resistance value. The first mode register 131 may output the third selection termination control signal SCNT3 extracted from the buffered address BADD<1:L> to the third termination circuit 153. The third selection termination control signal SCNT3 may be activated to set the impedance value of the third termination circuit 153 as the first resistance value. A logic level of the first to third selection termination control signals SCNT1, SCNT2 and SCNT3 which are activated may be set to be different according to the embodiments.

The second mode register 132 may extract a first termination flag RTT_PARK, a second termination flag RTT_NOM and a third termination flag RTT_WR from the buffered address BADD<1:L> to store the first to third termination flags RTT_PARK, RTT_NOM and RTT_WR therein if the mode register write command MRW is generated. The second mode register 132 may output the first to third termination flags RTT_PARK, RTT_NOM and RTT_WR extracted from the buffered address BADD<1:L> to the termination control signal generation circuit 141. The first termination flag RTT_PARK may be generated to set each of the impedance values of the first to third termination circuits 151, 152 and 153 as a second resistance value while the on-die termination command ODT is not generated. The second termination flag RTT_NOM may be generated to set each of the impedance values of the first to third termination circuits 151, 152 and 153 as a third resistance value if the on-die termination command ODT is generated without generation of the write command WT. The third termination flag RTT_WR may be generated to set each of the impedance values of the first to third termination circuits 151, 152 and 153 as a fourth resistance value if both of the write command WT and the on-die termination command ODT are generated. In the present embodiment, the second, third and fourth resistance values may be set to be different from each other. In the present embodiment, the second, third and fourth resistance values may be set to be different from the first resistance value. In the present embodiment, bits for extracting the first, second and third termination flags RTT_PARK, RTT_NOM and RTT_WR among bits included in the buffered address BADD<1:L> may be set to be different from bits for extracting the first, second and third selection termination control signals SCNT1, SCNT2 and SCNT3 among the bits included in the buffered address BADD<1:L>.

The termination control signal generation circuit 141 may generate a termination control signal TCNT<1:3> having a first logic level combination based on the first termination flag RTT_PARK when the on-die termination command ODT is not generated. The termination control signal generation circuit 141 may generate the termination control signal TCNT<1:3> having a second logic level combination based on the second termination flag RTT_NOM when the on-die termination command ODT is generated without generation of the write command WT. The termination control signal generation circuit 141 may generate the termination control signal TCNT<1:3> having the second logic level combination based on the second termination flag RTT_NOM when the on-die termination command ODT is generated with generation of the non-target write command NT_WT or the non-target read command NT_RD. The termination control signal generation circuit 141 may generate the termination control signal TCNT<1:3> having a third logic level combination based on the third termination flag RTT_WR when the on-die termination command ODT and the write command WT are generated. The first, second and third logic level combinations of the termination control signal TCNT<1:3> may be set to be different according to the embodiments.

The impedance value of the first termination circuit 151 may be set as the first resistance value when the first selection termination control signal SCNT1 is activated. The impedance value of the first termination circuit 151 may be set as the second resistance value when the termination control signal TCNT<1:3> having the first logic level combination is inputted to the first termination circuit 151. The impedance value of the first termination circuit 151 may be set as the third resistance value when the termination control signal TCNT<1:3> having the second logic level combination is inputted to the first termination circuit 151. The impedance value of the first termination circuit 151 may be set as the fourth resistance value when the termination control signal TCNT<1:3> having the third logic level combination is inputted to the first termination circuit 151. A configuration and an operation of the first termination circuit 151 will be described with reference to FIGS. 2 to 6 later.

The impedance value of the second termination circuit 152 may be set as the first resistance value when the second selection termination control signal SCNT2 is activated. The impedance value of the second termination circuit 152 may be set as the second resistance value when the termination control signal TCNT<1:3> having the first logic level combination is inputted to the second termination circuit 152. The impedance value of the second termination circuit 152 may be set as the third resistance value when the termination control signal TCNT<1:3> having the second logic level combination is inputted to the second termination circuit 152. The impedance value of the second termination circuit 152 may be set as the fourth resistance value when the termination control signal TCNT<1:3> having the third logic level combination is inputted to the second termination circuit 152. A configuration and an operation of the second termination circuit 152 will be described with reference to FIG. 7 later.

The impedance value of the third termination circuit 153 may be set as the first resistance value when the third selection termination control signal SCNT3 is activated. The impedance value of the third termination circuit 153 may be set as the second resistance value when the termination control signal TCNT<1:3> having the first logic level combination is inputted to the third termination circuit 153. The impedance value of the third termination circuit 153 may be set as the third resistance value when the termination control signal TCNT<1:3> having the second logic level combination is inputted to the third termination circuit 153. The impedance value of the third termination circuit 153 may be set as the fourth resistance value when the termination control signal TCNT<1:3> having the third logic level combination is inputted to the third termination circuit 153. A configuration and an operation of the third termination circuit 153 will be described with reference to FIG. 8 later.

Figure 2:
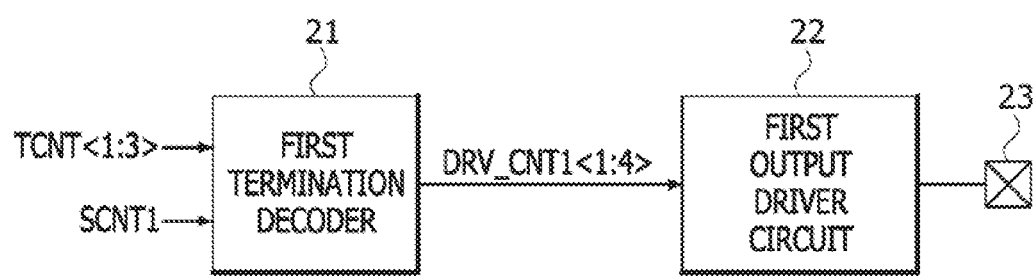
FIG. 2 is a block diagram illustrating an example of a first termination circuit included in the semiconductor device of FIG. 1.

Referring to FIG. 2, the first termination circuit 151 may include a first termination decoder 21, a first output driver circuit 22 and a first output pad 23.

The first termination decoder 21 may generate a first drive control signal DRV_CNT1<1:4> based on the termination control signal TCNT<1:3> and the first selection termination control signal SCNT1. The first termination decoder 21 may generate the first drive control signal DRV_CNT1<1:4> including bits, all of which are activated when the first selection termination control signal SCNT1 is activated. The first termination decoder 21 may generate the first drive control signal DRV_CNT1<1:4> including the bits, activation states of which are controlled according to a logic level combination of the termination control signal TCNT<1:3>. The logic level combination of the termination control signal TCNT<1:3> for activating the bits included in the first drive control signal DRV_CNT1<1:4> may be set to be different according to the embodiments. A configuration and an operation of the first termination decoder 21 will be described with reference to FIGS. 3 and 4 later.

The first output driver circuit 22 may be electrically connected to the first output pad 23 and may have an impedance value which is controlled by the first drive control signal DRV_CNT1<1:4>. The first output driver circuit 22 may be configured to include a plurality of unit resistors (not shown). The impedance value of the first output driver circuit 22 may be set as a resistance value which is determined by the unit resistors that are selected by bits activated among the bits included in the first drive control signal DRV_CNT1<1:4>. A configuration and an operation of the first output driver circuit 22 will be described with reference to FIGS. 5 and 6 later.

Figure 3:
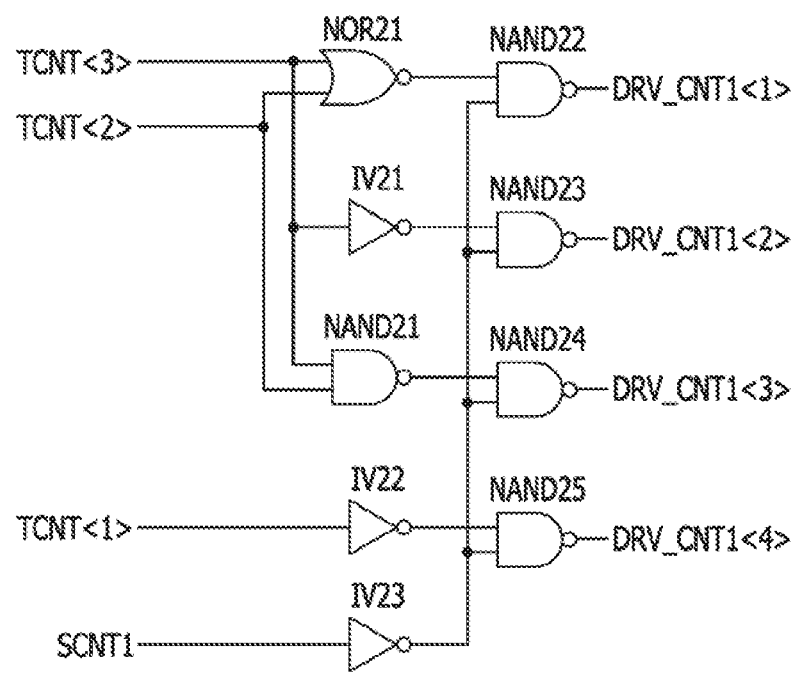
FIG. 3 is a circuit diagram illustrating an example of a first termination decoder included in the first termination circuit of FIG. 2.

Referring to FIG. 3, the first termination decoder 21 may be configured to perform a NOR operation, NAND operation, and inversion operation, and may include, for example but not limited to, a NOR gate NOR21, NAND gates NAND21~NAND25 and inverters IV21~IV23. The NOR gate NOR21 may perform a logical NOR operation of a second bit TCNT<2> and a third bit TCNT<3> of the termination control signal TCNT<1:3>. The inverter IV21 may inversely buffer the third bit TCNT<3> of the termination control signal TCNT<1:3> to output the inversely buffered signal of the third bit TCNT<3> of the termination control signal TCNT<1:3>. The NAND gate NAND21 may perform a logical NAND operation of the second bit TCNT<2> and the third bit TCNT<3> of the termination control signal TCNT<1:3>. The inverter IV22 may inversely buffer a first bit TCNT<1> of the termination control signal TCNT<1:3> to output the inversely buffered signal of the first bit TCNT<1> of the termination control signal TCNT<1:3>. The inverter IV23 may inversely buffer the first selection termination control signal SCNT1 to output the inversely buffered signal of the first selection termination control signal SCNT1. The NAND gate NAND22 may perform a logical NAND operation of an output signal of the NOR gate NOR21 and an output signal of the inverter IV23 to generate a datum of a first bit DRV_CNT1<1> of the first drive control signal DRV_CNT1<1:4>. The NAND gate NAND23 may perform a logical NAND operation of an output signal of the inverter IV21 and an output signal of the inverter IV23 to generate a datum of a second bit DRV_CNT1<2> of the first drive control signal DRV_CNT1<1:4>. The NAND gate NAND24 may perform a logical NAND operation of an output signal of the NAND gate NAND21 and an output signal of the inverter IV23 to generate a datum of a third bit DRV_CNT1<3> of the first drive control signal DRV_CNT1<1:4>. The NAND gate NAND25 may perform a logical NAND operation of an output signal of the inverter IV22 and an output signal of the inverter IV23 to generate a datum of a fourth bit DRV_CNT1<4> of the first drive control signal DRV_CNT1<1:4>.

The first termination decoder 21 may activate all of the bits included in the first drive control signal DRV_CNT1<1:4> when the first selection termination control signal SCNT1 is activated to have a logic "high" level. The first termination decoder 21 may generate the first drive control signal DRV_CNT1<1:4> including the bits, activation states of which are controlled according to a logic level combination of the termination control signal TCNT<1:3> while the first selection termination control signal SCNT1 is inactivated to have a logic "low" level. Various logic level combinations of the first drive control signal DRV_CNT1<1:4> generated according to logic level combinations of the termination control signal TCNT<1:3> and activation/inactivation of the first selection termination control signal SCNT1 will be described hereinafter with reference to a table of FIG. 4.

As illustrated in FIG. 4, if the first selection termination control signal SCNT1 is inactivated to have a logic "low(L)" level and the termination control signal TCNT<1:3> is set to have a logic level combination of 'L,L,L', the first drive control signal DRV_CNT1<1:4> may be generated to have a logic level combination of 'L,L,L,L'. In the termination control signal TCNT<1:3>, the logic level combination of 'L,L,L' means that a first bit TCNT<1> of the termination control signal TCNT<1:3> has a logic "low(L)" level, a second bit TCNT<2> of the termination control signal TCNT<1:3> has a logic "low(L)" level, and a third bit TCNT<3> of the termination control signal TCNT<1:3> has a logic "low(L)" level. In the first drive control signal DRV_CNT1<1:4>, the logic level combination of 'L,L,L,L' means that a first bit DRV_CNT1<1> of the first drive control signal DRV_CNT1<1:4> is inactivated to have a logic "low(L)" level, a second bit DRV_CNT1<2> of the first drive control signal DRV_CNT1<1:4> is inactivated to have a logic "low(L)" level, a third bit DRV_CNT1<3> of the first drive control signal DRV_CNT1<1:4> is inactivated to have a logic "low(L)" level, and a fourth bit DRV_CNT1<4> of the first drive control signal DRV_CNT1<1:4> is inactivated to have a logic "low(L)" level.

As illustrated in FIG. 4, if the first selection termination control signal SCNT1 is inactivated to have a logic "low(L)" level and the termination control signal TCNT<1:3> is set to have a logic level combination of 'H,L,L', the first drive control signal DRV_CNT1<1:4> may be generated to have a logic level combination of 'L,L,L,H'. In the termination control signal TCNT<1:3>, the logic level combination of 'H,L,L' means that a first bit TCNT<1> of the termination control signal TCNT<1:3> has a logic "high(H)" level, a second bit TCNT<2> of the termination control signal TCNT<1:3> has a logic "low(L)" level, and a third bit TCNT<3> of the termination control signal TCNT<1:3> has a logic "low(L)" level. In the first drive control signal DRV_CNT1<1:4>, the logic level combination of 'L,L,L,H' means that a first bit DRV_CNT1<1> of the first drive control signal DRV_CNT1<1:4> is inactivated to have a logic "low(L)" level, a second bit DRV_CNT1<2> of the first drive control signal DRV_CNT1<1:4> is inactivated to have a logic "low(L)" level, a third bit DRV_CNT1<3> of the first drive control signal DRV_CNT1<1:4> is inactivated to have a logic "low(L)" level, and a fourth bit DRV_CNT1<4> of the first drive control signal DRV_CNT1<1:4> is activated to have a logic "high(H)" level.

As illustrated in FIG. 4, if the first selection termination control signal SCNT1 is inactivated to have a logic "low(L)" level and the termination control signal TCNT<1:3> is set to have a logic level combination of 'L,H,L', the first drive control signal DRV_CNT1<1:4> may be generated to have a logic level combination of 'H,L,L,L'. In the termination control signal TCNT<1:3>, the logic level combination of 'L,H,L' means that a first bit TCNT<1> of the termination control signal TCNT<1:3> has a logic "low(L)" level, a second bit TCNT<2> of the termination control signal TCNT<1:3> has a logic "high(H)" level, and a third bit TCNT<3> of the termination control signal TCNT<1:3> has a logic "low(L)" level. In the first drive control signal DRV_CNT1<1:4>, the logic level combination of 'H,L,L,L' means that a first bit DRV_CNT1<1> of the first drive control signal DRV_CNT1<1:4> is activated to have a logic "high(H)" level, a second bit DRV_CNT1<2> of the first drive control signal DRV_CNT1<1:4> is inactivated to have a logic "low(L)" level, a third bit DRV_CNT1<3> of the first drive control signal DRV_CNT1<1:4> is inactivated to have a logic "low(L)" level, and a fourth bit DRV_CNT1<4> of the first drive control signal DRV_CNT1<1:4> is inactivated to have a logic "low(L)" level.

As illustrated in FIG. 4, if the first selection termination control signal SCNT1 is inactivated to have a logic "low(L)" level and the termination control signal TCNT<1:3> is set to have a logic level combination of 'H,H,L', the first drive control signal DRV_CNT1<1:4> may be generated to have a logic level combination of 'H,L,L,H'. In the termination control signal TCNT<1:3>, the logic level combination of 'H,H,L' means that a first bit TCNT<1> of the termination control signal TCNT<1:3> has a logic "high(H)" level, a second bit TCNT<2> of the termination control signal TCNT<1:3> has a logic "high(H)" level, and a third bit TCNT<3> of the termination control signal TCNT<1:3> has a logic "low(L)" level. In the first drive control signal DRV_CNT1<1:4>, the logic level combination of 'H,L,L,H' means that a first bit DRV_CNT1<1> of the first drive control signal DRV_CNT1<1:4> is activated to have a logic "high(H)" level, a second bit DRV_CNT1<2> of the first drive control signal DRV_CNT1<1:4> is inactivated to have a logic "low(L)" level, a third bit DRV_CNT1<3> of the first drive control signal DRV_CNT1<1:4> is inactivated to have a logic "low(L)" level, and a fourth bit DRV_CNT1<4> of the first drive control signal DRV_CNT1<1:4> is activated to have a logic "high(H)" level.

As illustrated in FIG. 4, if the first selection termination control signal SCNT1 is inactivated to have a logic "low(L)" level and the termination control signal TCNT<1:3> is set to have a logic level combination of 'L,L,H', the first drive control signal DRV_CNT1<1:4> may be generated to have a logic level combination of 'H,H,L,L'. In the termination control signal TCNT<1:3>, the logic level combination of 'L,L,H' means that a first bit TCNT<1> of the termination control signal TCNT<1:3> has a logic "low(L)" level, a second bit TCNT<2> of the termination control signal TCNT<1:3> has a logic "low(L)" level, and a third bit TCNT<3> of the termination control signal TCNT<1:3> has a logic "high(H)" level. In the first drive control signal DRV_CNT1<1:4>, the logic level combination of 'H,H,L,L' means that a first bit DRV_CNT1<1> of the first drive control signal DRV_CNT1<1:4> is activated to have a logic "high(H)" level, a second bit DRV_CNT1<2> of the first drive control signal DRV_CNT1<1:4> is activated to have a logic "high(H)" level, a third bit DRV_CNT1<3> of the first drive control signal DRV_CNT1<1:4> is inactivated to have a logic "low(L)" level, and a fourth bit DRV_CNT1<4> of the first drive control signal DRV_CNT1<1:4> is inactivated to have a logic "low(L)" level.

As illustrated in FIG. 4, if the first selection termination control signal SCNT1 is inactivated to have a logic "low(L)" level and the termination control signal TCNT<1:3> is set to have a logic level combination of 'H,L,H', the first drive control signal DRV_CNT1<1:4> may be generated to have a logic level combination of 'H,H,L,H'. In the termination control signal TCNT<1:3>, the logic level combination of 'H,L,H' means that a first bit TCNT<1> of the termination control signal TCNT<1:3> has a logic "high(H)" level, a second bit TCNT<2> of the termination control signal TCNT<1:3> has a logic "low(L)" level, and a third bit TCNT<3> of the termination control signal TCNT<1:3> has a logic "high(H)" level. In the first drive control signal DRV_CNT1<1:4>, the logic level combination of 'H,H,L,H' means that a first bit DRV_CNT1<1> of the first drive control signal DRV_CNT1<1:4> is activated to have a logic "high(H)" level, a second bit DRV_CNT1<2> of the first drive control signal DRV_CNT1<1:4> is activated to have a logic "high(H)" level, a third bit DRV_CNT1<3> of the first drive control signal DRV_CNT1<1:4> is inactivated to have a logic "low(L)" level, and a fourth bit DRV_CNT1<4> of the first drive control signal DRV_CNT1<1:4> is activated to have a logic "high(H)" level.

As illustrated in FIG. 4, if the first selection termination control signal SCNT1 is inactivated to have a logic "low(L)" level and the termination control signal TCNT<1:3> is set to have a logic level combination of 'L,H,H', the first drive control signal DRV_CNT1<1:4> may be generated to have a logic level combination of 'H,H,H,L'. In the termination control signal TCNT<1:3>, the logic level combination of 'L,H,H' means that a first bit TCNT<1> of the termination control signal TCNT<1:3> has a logic "low(L)" level, a second bit TCNT<2> of the termination control signal TCNT<1:3> has a logic "high(H)" level, and a third bit TCNT<3> of the termination control signal TCNT<1:3> has a logic "high(H)" level. In the first drive control signal DRV_CNT1<1:4>, the logic level combination of 'H,H,H,L' means that a first bit DRV_CNT1<1> of the first drive control signal DRV_CNT1<1:4> is activated to have a logic "high(H)" level, a second bit DRV_CNT1<2> of the first drive control signal DRV_CNT1<1:4> is activated to have a logic "high(H)" level, a third bit DRV_CNT1<3> of the first drive control signal DRV_CNT1<1:4> is activated to have a logic "high(H)" level, and a fourth bit DRV_CNT1<4> of the first drive control signal DRV_CNT1<1:4> is inactivated to have a logic "low(L)" level.

As illustrated in FIG. 4, if the first selection termination control signal SCNT1 is inactivated to have a logic "low(L)" level and the termination control signal TCNT<1:3> is set to have a logic level combination of 'H,H,H', the first drive control signal DRV_CNT1<1:4> may be generated to have a logic level combination of 'H,H,H,H'. In the termination control signal TCNT<1:3>, the logic level combination of 'H,H,H' means that a first bit TCNT<1> of the termination control signal TCNT<1:3> has a logic "high(H)" level, a second bit TCNT<2> of the termination control signal TCNT<1:3> has a logic "high(H)" level, and a third bit TCNT<3> of the termination control signal TCNT<1:3> has a logic "high(H)" level. In the first drive control signal DRV_CNT1<1:4>, the logic level combination of 'H,H,H,H' means that a first bit DRV_CNT1<1> of the first drive control signal DRV_CNT1<1:4> is activated to have a logic "high(H)" level, a second bit DRV_CNT1<2> of the first drive control signal DRV_CNT1<1:4> is activated to have a logic "high(H)" level, a third bit DRV_CNT1<3> of the first drive control signal DRV_CNT1<1:4> is activated to have a logic "high(H)" level, and a fourth bit DRV_CNT1<4> of the first drive control signal DRV_CNT1<1:4> is activated to have a logic "high(H)" level.

As illustrated in FIG. 4, if the first selection termination control signal SCNT1 is activated to have a logic "high(H)" level, the first drive control signal DRV_CNT1<1:4> may be generated to have a logic level combination of 'H,H,H,H' regardless of the termination control signal TCNT<1:3>.

Figure 5:
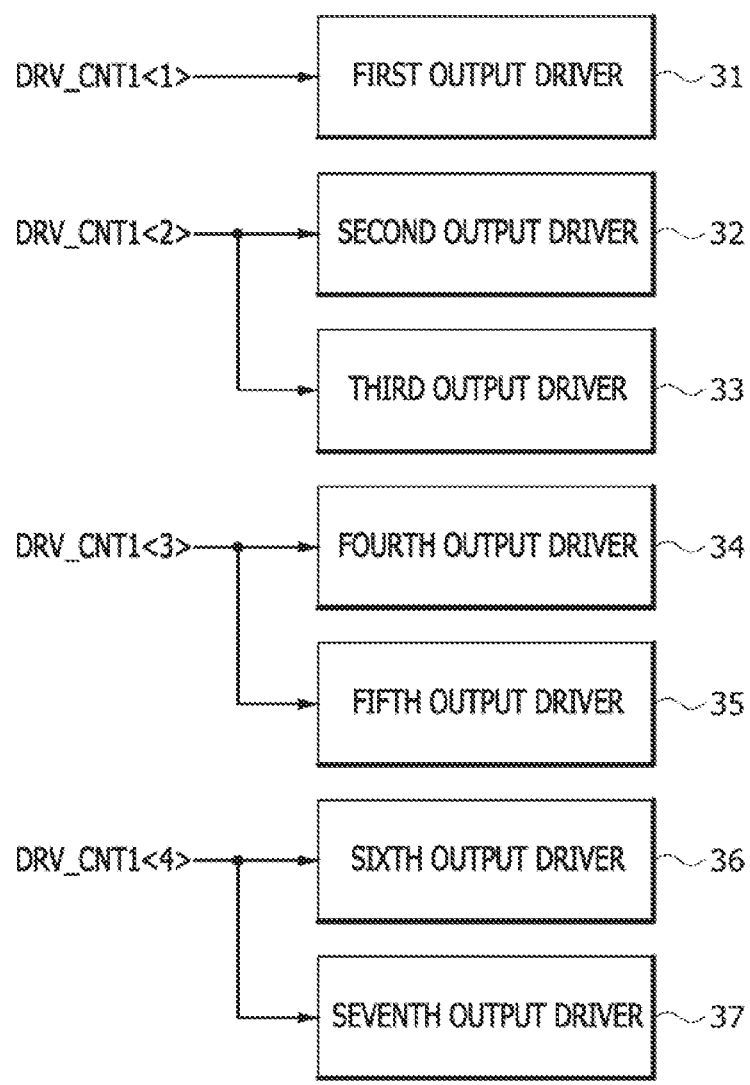
FIG. 5 is a block diagram illustrating an example of a first output driver circuit included in the first termination circuit of FIG. 2.

Referring to FIG. 5, the first output driver circuit 22 may include a first output driver 31, a second output driver 32, a third output driver 33, a fourth output driver 34, a fifth output driver 35, a sixth output driver 36 and a seventh output driver 37. The first output driver 31 may be turned on if the first bit DRV_CNT1<1> of the first drive control signal DRV_CNT1<1:4> is activated to have a logic "high" level. If the first output driver 31 is turned on, the impedance value of the first output driver 31 may be set to have a resistance value of the unit resistor. The second output driver 32 may be turned on if the second bit DRV_CNT1<2> of the first drive control signal DRV_CNT1<1:4> is activated to have a logic "high" level. If the second output driver 32 is turned on, the impedance value of the second output driver 32 may be set to have a resistance value of the unit resistor. The third output driver 33 may be turned on if the second bit DRV_CNT1<2> of the first drive control signal DRV_CNT1<1:4> is activated to have a logic "high" level. If the third output driver 33 is turned on, the impedance value of the third output driver 33 may be set to have a resistance value of the unit resistor. The fourth output driver 34 may be turned on if the third bit DRV_CNT1<3> of the first drive control signal DRV_CNT1<1:4> is activated to have a logic "high" level. If the fourth output driver 34 is turned on, the impedance value of the fourth output driver 34 may be set to have a resistance value of the unit resistor. The fifth output driver 35 may be turned on if the third bit DRV_CNT1<3> of the first drive control signal DRV_CNT1<1:4> is activated to have a logic "high" level. If the fifth output driver 35 is turned on, the impedance value of the fifth output driver 35 may be set to have a resistance value of the unit resistor. The sixth output driver 36 may be turned on if the fourth bit DRV_CNT1<4> of the first drive control signal DRV_CNT1<1:4> is activated to have a logic "high" level. If the sixth output driver 36 is turned on, the impedance value of the sixth output driver 36 may be set to have a resistance value of the unit resistor. The seventh output driver 37 may be turned on if the fourth bit DRV_CNT1<4> of the first drive control signal DRV_CNT1<1:4> is activated to have a logic "high" level. If the seventh output driver 37 is turned on, the impedance value of the seventh output driver 37 may be set to have a resistance value of the unit resistor.

The first output driver 31, the second output driver 32, the third output driver 33, the fourth output driver 34, the fifth output driver 35, the sixth output driver 36 and the seventh output driver 37 may be connected to the first output pad (23 of FIG. 2) in parallel. The impedance of the first output driver circuit 22 may be determined according to whether the first output driver 31, the second output driver 32, the third output driver 33, the fourth output driver 34, the fifth output driver 35, the sixth output driver 36 and the seventh output driver 37 are individually turned on. An operation of the first output driver circuit 22 for setting the impedance of the output driver circuit 22 will be described hereinafter with reference to FIG. 6.

As illustrated in FIG. 6, if the first bit DRV_CNT1<1> of the first drive control signal DRV_CNT1<1:4> is activated to have a logic "high" level, the first output driver 31 may be turned on so that the impedance value of the first output driver circuit 22 is set as a resistance value of the unit resistor (i.e., a unit resistance value RU). For example, if the unit resistance value RU is set to be 240Ω and the first bit DRV_CNT1<1> of the first drive control signal DRV_CNT1<1:4> is activated to have a logic "high" level, the impedance value of the first output driver circuit 22 may be set to be 240Ω.

As illustrated in FIG. 6, if the fourth bit DRV_CNT1<4> of the first drive control signal DRV_CNT1<1:4> is activated to have a logic "high" level, the sixth and seventh output drivers 36 and 37 connected to the first output pad (23 of FIG. 2) in parallel may be turned on so that the impedance value of the first output driver circuit 22 is set as half the unit resistance value RU. For example, if the unit resistance value RU is set to be 240Ω and the fourth bit DRV_CNT1<4> of the first drive control signal DRV_CNT1<1:4> is activated to have a logic "high" level, the impedance value of the first output driver circuit 22 may be set to be 120Ω.

As illustrated in FIG. 6, if the first bit DRV_CNT1<1> and the second bit DRV_CNT1<2> of the first drive control signal DRV_CNT1<1:4> are activated to have a logic "high" level, the first, second and third output drivers 31, 32 and 33 connected to the first output pad (23 of FIG. 2) in parallel may be turned on so that the impedance value of the first output driver circuit 22 is set as one third the unit resistance value RU. For example, if the unit resistance value RU is set to be 240Ω and the first and second bits DRV_CNT1<1:2> of the first drive control signal DRV_CNT1<1:4> are activated to have a logic "high" level, the impedance value of the first output driver circuit 22 may be set to be 80Ω.

As illustrated in FIG. 6, if the first bit DRV_CNT1<1>, the second bit DRV_CNT1<2> and the third bit DRV_CNT1<3> of the first drive control signal DRV_CNT1<1:4> are activated to have a logic "high" level, the first to fifth output drivers 31, 32, 33, 34 and 35 connected to the first output pad (23 of FIG. 2) in parallel may be turned on so that the impedance value of the first output driver circuit 22 is set as one fifth the unit resistance value RU. As used herein, the tilde "~" indicates a range of components. For example "1~5" as illustrated in FIG. 6 indicates the first to fifth output drivers 31, 32, 33, 34 and 35. For example, if the unit resistance value RU is set to be 240Ω and the first to third bits DRV_CNT1<1:3> of the first drive control signal DRV_CNT1<1:4> are activated to have a logic "high" level, the impedance value of the first output driver circuit 22 may be set to be 48Ω.

As illustrated in FIG. 6, if the first bit DRV_CNT1<1>, the second bit DRV_CNT1<2>, the third bit DRV_CNT1<3> and the fourth bit DRV_CNT1<4> of the first drive control signal DRV_CNT1<1:4> are activated to have a logic "high" level, the first to seventh output drivers 31, 32, 33, 34, 35, 36 and 37 connected to the first output pad (23 of FIG. 2) in parallel may be turned on so that the impedance value of the first output driver circuit 22 is set as one seventh the unit resistance value RU. For example, if the unit resistance value RU is set to be 240Ω and the first to fourth bits DRV_CNT1<1:4> of the first drive control signal DRV_CNT1<1:4> are activated to have a logic "high" level, the impedance value of the first output driver circuit 22 may be set to be approximately 34Ω.

Figure 7:
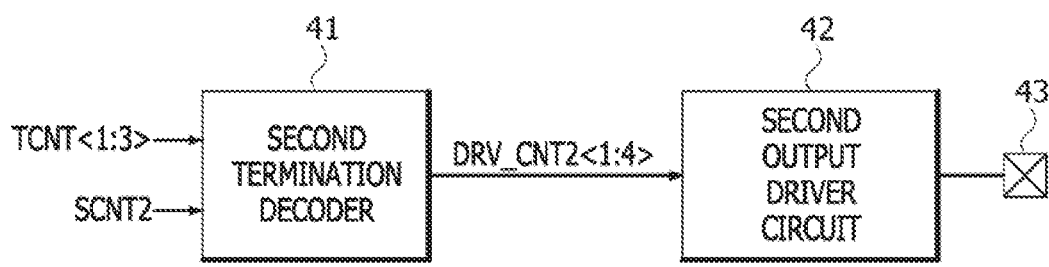
FIG. 7 is a block diagram illustrating an example of a second termination circuit included in the semiconductor device of FIG. 1.

Referring to FIG. 7, the second termination circuit 152 may include a second termination decoder 41, a second output driver circuit 42 and a second output pad 43.

The second termination decoder 41 may generate a second drive control signal DRV_CNT2<1:4> based on the termination control signal TCNT<1:3> and the second selection termination control signal SCNT2. The second termination decoder 41 may generate the second drive control signal DRV_CNT2<1:4> including bits, all of which are activated when the second selection termination control signal SCNT2 is activated. The second termination decoder 41 may generate the second drive control signal DRV_CNT2<1:4> including the bits, activation states of which are controlled according to a logic level combination of the termination control signal TCNT<1:3>. The logic level combination of the termination control signal TCNT<1:3> for activating the bits included in the second drive control signal DRV_CNT2<1:4> may be set to be different according to the embodiments. A configuration and an operation of the second termination decoder 41 may be substantially the same as the configuration and the operation of the first termination decoder 21 described with reference to FIGS. 3 and 4. Thus, detailed descriptions of the second termination decoder 41 will be omitted hereinafter.

The second output driver circuit 42 may be electrically connected to the second output pad 43 and may have an impedance value which is controlled by the second drive control signal DRV_CNT2<1:4>. The second output driver circuit 42 may be configured to include a plurality of unit resistors (not shown). The impedance value of the second output driver circuit 42 may be set as a resistance value which is determined by the unit resistors that are selected by bits activated among the bits included in the second drive control signal DRV_CNT2<1:4>. A configuration and an operation of the second output driver circuit 42 may be substantially the same as the configuration and the operation of the first output driver circuit 22 described with reference to FIGS. 5 and 6. Thus, detailed descriptions of the second output driver circuit 42 will be omitted hereinafter.

Figure 8:
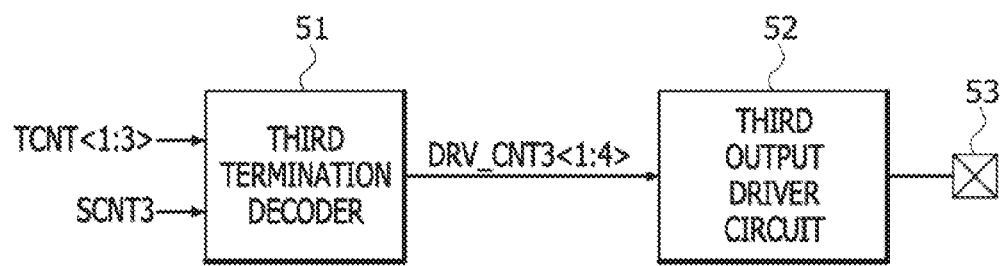
FIG. 8 is a block diagram illustrating an example of a third termination circuit included in the semiconductor device of FIG. 1.

Referring to FIG. 8, the third termination circuit 153 may include a third termination decoder 51, a third output driver circuit 52 and a third output pad 53.

The third termination decoder 51 may generate a third drive control signal DRV_CNT3<1:4> based on the termination control signal TCNT<1:3> and the third selection termination control signal SCNT3. The third termination decoder 51 may generate the third drive control signal DRV_CNT3<1:4> including bits, all of which are activated when the third selection termination control signal SCNT3 is activated. The third termination decoder 51 may generate the third drive control signal DRV_CNT3<1:4> including the bits, activation states of which are controlled according to a logic level combination of the termination control signal TCNT<1:3>. The logic level combination of the termination control signal TCNT<1:3> for activating the bits included in the third drive control signal DRV_CNT3<1:4> may be set to be different according to the embodiments. A configuration and an operation of the third termination decoder 51 may be substantially the same as the configuration and the operation of the first termination decoder 21 described with reference to FIGS. 3 and 4. Thus, detailed descriptions of the third termination decoder 51 will be omitted hereinafter.

The third output driver circuit 52 may be electrically connected to the third output pad 53 and may have an impedance value which is controlled by the third drive control signal DRV_CNT3<1:4>. The third output driver circuit 52 may be configured to include a plurality of unit resistors (not shown). The impedance value of the third output driver circuit 52 may be set as a resistance value which is determined by the unit resistors that are selected by bits activated among the bits included in the third drive control signal DRV_CNT3<1:4>. A configuration and an operation of the third output driver circuit 52 may be substantially the same as the configuration and the operation of the first output driver circuit 22 described with reference to FIGS. 5 and 6. Thus, detailed descriptions of the third output driver circuit 52 will be omitted hereinafter.

In the semiconductor device 100 having an aforementioned configuration, an operation for adjusting the impedance values of the first to third termination circuits 151, 152 and 153 will be described hereinafter with reference to FIG. 1.

If only the first selection termination control signal SCNT1 among the first to third selection termination control signals SCNT1, SCNT2 and SCNT3 is set to have an activation state during the mode register write operation, the impedance value of the first termination circuit 151 may be set to have the first resistance value regardless of an operation of the semiconductor device 100. For example, even though the impedance values of the second and third termination circuits 152 and 153 are set to have the second resistance value according to a logic level combination of the termination control signal TCNT<1:3> which is set by an operation of the semiconductor device 100, the impedance value of the first termination circuit 151 may be set to have the first resistance value by the first selection termination control signal SCNT1 which is activated. In an embodiment, if only the first selection termination control signal SCNT1 among the first to third selection termination control signals SCNT1, SCNT2 and SCNT3 is set to have an activation state during the mode register write operation, the impedance value of the first termination circuit 151 may be set to have the first resistance value regardless of the termination control signal TCNT<1:3> received by the first termination circuit 151.

If the first and second selection termination control signals SCNT1 and SCNT2 among the first to third selection termination control signals SCNT1, SCNT2 and SCNT3 are set to have an activation state during the mode register write operation, the impedance value of the first and second termination circuits 151 and 152 may be set to have the first resistance value regardless of an operation of the semiconductor device 100. For example, even though the impedance values of the third termination circuit 153 is set to have the second resistance value according to a logic level combination of the termination control signal TCNT<1:3> which is set by an operation of the semiconductor device 100, the impedance value of the first and second termination circuits 151 and 152 may be set to have the first resistance value by the first selection termination control signal SCNT1 which is activated and the second selection termination control signal SCNT2 which is activated. In an embodiment, if the first and second selection termination control signals SCNT1 and SCNT2 among the first to third selection termination control signals SCNT1, SCNT2 and SCNT3 are set to have an activation state during the mode register write operation, the impedance value of the first and second termination circuits 151 and 152 may be set to have the first resistance value regardless of the termination control signal TCNT<1:3> received by the first and second termination circuits 151 and 152.

As described above, the semiconductor device 100 according to an embodiment may control the activation states of the first to third selection termination control signals SCNT1, SCNT2 and SCNT3 to adjust impedance values of the first to third termination circuits 151, 152 and 153. As a result, crosstalk between the first, second and third output pads 23, 43 and 53 may be more readily measured.

Figure 9:
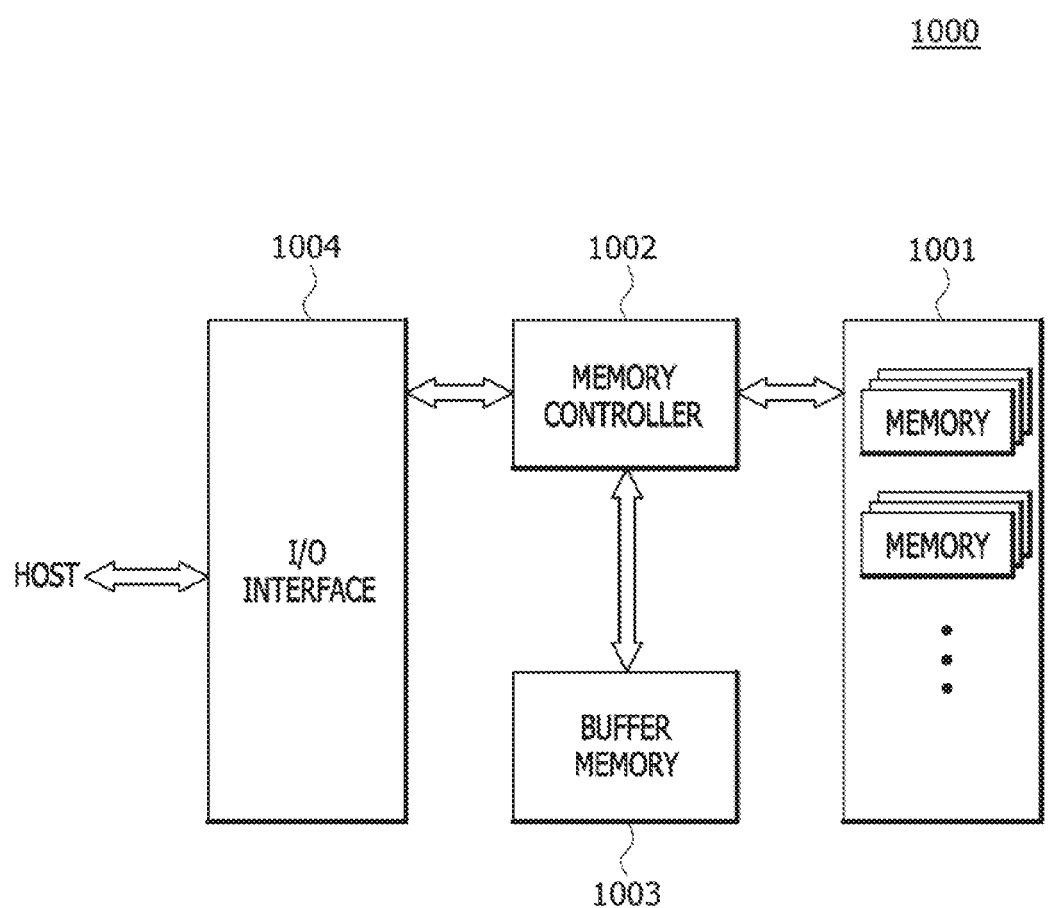
FIG. 9 is a block diagram illustrating a configuration of an electronic system employing the semiconductor device illustrated in FIG. 1.

The semiconductor device 100 described with reference to FIGS. 1 to 8 may be applied to an electronic system that includes a memory system, a graphic system, a computing system, a mobile system, or the like. For example, as illustrated in FIG. 9, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 9 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read out the data stored therein and may output the data to the memory controller 1002. The buffer memory 1003 may include a volatile memory such as a dynamic random access memory (DRAM), a mobile DRAM, or a static random access memory (SRAM). The buffer memory 1003 may include the semiconductor device 100 illustrated in FIG. 1.

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a first mode register configured to store a first selection termination control signal and a second selection termination control signal when a mode register write operation is performed;
a first termination circuit comprising an impedance value and configured to control the impedance value of the first termination circuit based on the first selection termination control signal and a termination control signal; and
a second termination circuit comprising an impedance value and configured to control the impedance value of the second termination circuit based on the second selection termination control signal and the termination control signal, wherein the impedance values of the first and second termination circuits are controlled to be substantially equal to each other according to a logic level combination of the termination control signal.

2. The semiconductor device of claim 1, wherein the impedance value of the first termination circuit is set to have a first resistance value when the first selection termination control signal is activated.

3. The semiconductor device of claim 2, wherein the impedance value of the second termination circuit is set to have the first resistance value when the second selection termination control signal is activated.

4. The semiconductor device of claim 1, wherein the impedance value of the first termination circuit is set to have a first resistance value regardless of the termination control signal when the first selection termination control signal is activated.

5. The semiconductor device of claim 4, wherein the impedance value of the second termination circuit is set to have the first resistance value regardless of the termination control signal when the second selection termination control signal is activated.

6. The semiconductor device of claim 1, wherein a logic level combination of the termination control signal is controlled according to a command.

7. The semiconductor device of claim 1, wherein the first mode register extracts and stores the first selection termination control signal and the second selection termination control signal when the mode register write operation is performed and selectively activates at least one of the first selection termination control signal and the second selection termination control signal based on an address when the mode register write operation is performed.

8. The semiconductor device of claim 1, further comprising:
a second mode register configured to store a termination flag when the mode register write operation is performed; and
a termination control signal generation circuit configured to generate the termination control signal, wherein a logic level combination of the termination control signal is set based on the termination flag.

9. A semiconductor device comprising:
a first termination circuit comprising an impedance value and configured to control the impedance value of the first termination circuit based on a first selection termination control signal and a termination control signal; and
a second termination circuit comprising an impedance value and configured to control the impedance value of the second termination circuit based on a second selection termination control signal and the termination control signal,
wherein the impedance value of the first termination circuit is set to have a first resistance value when the first selection termination control signal is activated,
wherein the impedance value of the second termination circuit is set to have the first resistance value when the second selection termination control signal is activated, and
wherein the impedance values of the first and second termination circuits are controlled to be substantially equal to each other according to a logic level combination of the termination control signal.

10. The semiconductor device of claim 9,
wherein the impedance value of the first termination circuit is set to have the first resistance value regardless of the termination control signal when the first selection termination control signal is activated, and
wherein the impedance value of the second termination circuit is set to have the first resistance value regardless of the termination control signal when the second selection termination control signal is activated.

11. The semiconductor device of claim 9, wherein the logic level combination of the termination control signal is controlled according to a command.

12. The semiconductor device of claim 9, further comprising a first mode register configured to store the first selection termination control signal and the second selection termination control signal when a mode register write operation is performed.

13. The semiconductor device of claim 12, wherein the first mode register is configured to extract and store the first selection termination control signal and the second selection termination control signal when the mode register write operation is performed and selectively activate at least one of the first selection termination control signal and the second selection termination control signal based on an address when the mode register write operation is performed.

14. The semiconductor device of claim 12, further comprising:
a second mode register configured to store a termination flag when the mode register write operation is performed; and
a termination control signal generation circuit configured to generate the termination control signal, wherein a logic level combination of the termination control signal is set based on the termination flag.

15. A semiconductor device comprising:
a first termination circuit comprising an impedance value and configured to control the impedance value of the first termination circuit based on a first selection termination control signal and a termination control signal; and
a second termination circuit comprising an impedance value and configured to control the impedance value of the second termination circuit based on a second selection termination control signal and the termination control signal,
wherein the impedance value of the first termination circuit is set to have a first resistance value regardless of the termination control signal when the first selection termination control signal is activated, and
wherein the impedance value of the second termination circuit is set to have the first resistance value regardless of the termination control signal when the second selection termination control signal is activated.

16. The semiconductor device of claim 15, further comprising:
a first mode register configured to activate the first and second selection termination control signals based on an address.

* * * * *